United States Patent [19]

Kubozono et al.

[11] Patent Number: 5,248,351
[45] Date of Patent: Sep. 28, 1993

[54] COPPER NI-SI-P ALLOY FOR AN ELECTRONIC DEVICE

[75] Inventors: Kenji Kubozono; Takashi Nakagima, both of Sagamihara; Takefumi Itou; Kimio Hashizume, both of Amagasaki; Shinichi Iwase, Sagamihara, all of Japan

[73] Assignee: Mitsubishi Denki Kabushiki Kaisha, Tokyo, Japan

[21] Appl. No.: 835,082

[22] Filed: Feb. 18, 1992

Related U.S. Application Data

[63] Continuation of Ser. No. 578,407, Sep. 7, 1990, abandoned, which is a continuation-in-part of Ser. No. 335,937, Apr. 10, 1989, abandoned.

[30] Foreign Application Priority Data

Apr. 12, 1988 [JP] Japan .................................. 63-89383
Nov. 15, 1988 [JP] Japan .................................. 63-288041

[51] Int. Cl.⁵ .................................................. C22C 9/06
[52] U.S. Cl. ...................................... 148/414; 420/485; 148/685
[58] Field of Search ............... 426/481, 485; 148/413, 148/414, 434, 435

[56] References Cited

U.S. PATENT DOCUMENTS

| | | | |
|---|---|---|---|
| 2,155,405 | 4/1939 | Crampton et al. | 148/435 |
| 2,155,407 | 4/1939 | Crampton et al. | 148/433 |
| 4,362,579 | 12/1982 | Tsuji | 420/481 |
| 4,446,939 | 8/1984 | Kim et al. | 420/485 |

FOREIGN PATENT DOCUMENTS 57-116738 7/1982 Japan .
63-062834 3/1988 Japan .
63-130739 6/1988 Japan .

OTHER PUBLICATIONS

CA 113(10):83340m Mar. 1990.
Decision of the Bundespatentgericht of Apr. 25, 1990 (13W(pat) 48/47.
Bayer-Schwarzmaier-Zeiler, "10 years of BPatG", pp. 201–224.

Primary Examiner—H. Dean
Assistant Examiner—Margery S. Phipps
Attorney, Agent, or Firm—Oblon, Spivak, McClelland, Maier & Neustadt

[57] ABSTRACT

A copper alloy for an electronic device comprises 2.0 wt%–8 wt% of Ni, 0.1 wt%–0.8 wt% of P, 0.06 wt%–1 wt% of Si and the rest being Cu and unavoidable impurities.

The rest may include 0.03 wt%–2.0 wt% of Zn. The copper allow has an oxygen content of 20 ppm or less.

4 Claims, 1 Drawing Sheet

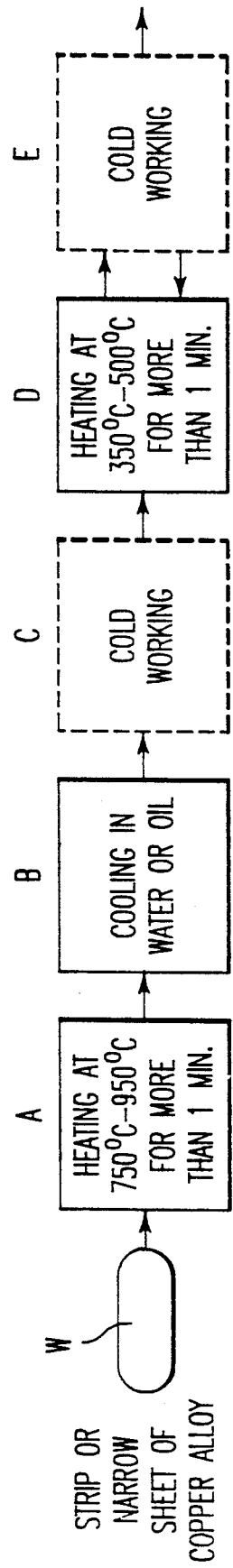
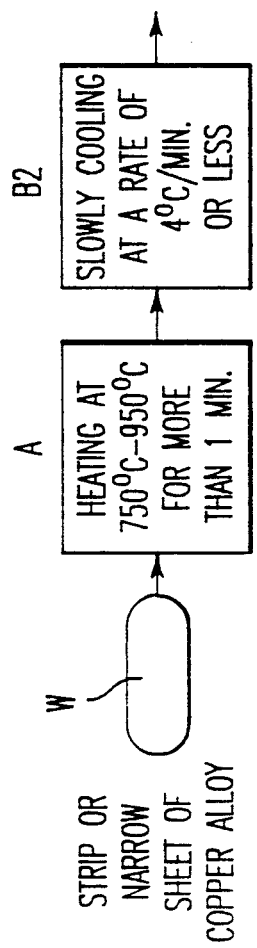
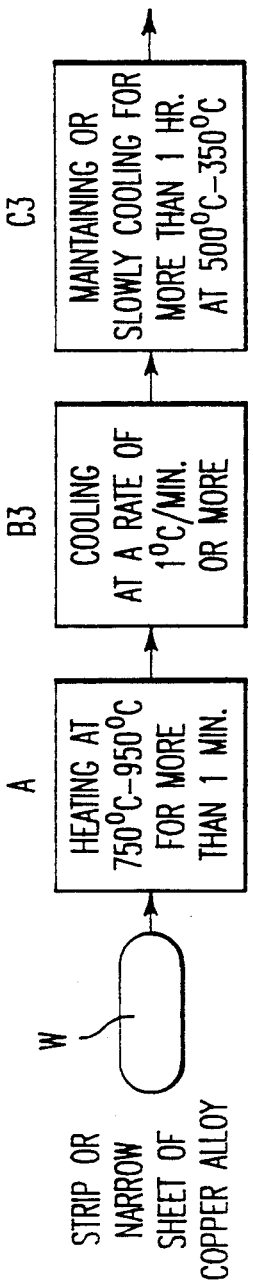

COPPER NI-SI-P ALLOY FOR AN ELECTRONIC DEVICE

This application is a continuation of application Ser. No. 07/578,407, filed on Sep. 7, 1990, now abandoned, which is a continuation-in-part of Ser. No. 07/335,937, filed on apr. 10, 1989, now abandoned.

BACKGROUND OF THE INVENTION

1. Field of the Invention

The present invention relates to a copper alloy used for an electronic device such as a lead frame for an integrated circuit or a connector and a method of preparing a copper alloy for the electronic device.

2. Discussion of Background

As materials used for electronic devices, ones having excellent anti-corrosion and heat resistance properties as well as a high tensile strength and a high electric conductivity are desired in order to satisfy demands of miniaturization of devices and reliability. As the materials for lead frames in integrated circuits, a copper series material such as Fe-42% Ni and an iron series material have been mainly used.

In recent years, demands for the copper series materials have been increasing because they have good heat releasing properties in highly integrated electronic devices. On the other hand, miniaturization of the devices requires thin copper series materials. However, the thin copper series materials could not assure a sufficient level of strength. Accordingly, the iron series materials such as Fe-42% Ni have been used for a QFP type IC package. In view of the above-mentioned trend, there is a test as to whether or not a material can satisfy such requirements that it has the same strength as Fe-42% Ni, i.e. a tensile strength of 70 kgf/mm$^2$ and an electric conductivity of more than 30% IACS. On the other hand, a material used for the connector should have a high spring characteristic as well as the same electric conductivity as a phosphor bronze alloy and a strength higher than the alloy.

Heretofore, there have been used as copper alloys for electronic devices a C19400 alloy (Copper Development Association) and a high conduction alloy such as Cu-0.1% Sn, Cu-0.1% Fe (a tensile strength of about 50 kgf/mm$^2$ or less and an electric conduction of 60% IACS or more) and a phosphor bronze alloy (having the same strength as Fe-42% Ni and a electric conduction of 20% IACS or more). Further, there has been used a beryllium - copper alloy as a high strength material but it is expensive.

Thus, the conventional materials proposed for the lead frames and the connectors have both advantage and disadvantage with respect to electric conductivity, strength and cost.

It is an object of the present invention to provide a copper alloy for satisfying both strength and electric conductivity and suitably used for an electronic device and a method of preparing a strip (or a narrow sheet) of copper alloy for the electronic device.

In accordance with the first invention, there is provided a copper alloy for an electronic device which comprises 2.0 wt% –8 wt% of Ni, 0.1 wt% –0.8 wt% of P, 0.06 wt% –1 wt% of Si and the rest being Cu and unavoidable impurities.

In accordance with the second invention, there is provided a copper alloy for an electronic device which comprises 2.0 wt% –8 wt% of Ni, 0.1 wt% –0.8 wt% of P, 0.06 wt% –1 wt% of Si and the rest being Cu and unavoidable impurities wherein the oxygen content is 20 ppm or less.

In accordance with the third invention, there is provided a copper alloy for an electronic device which comprises 2.0 wt% –8 wt% of Ni, 0.1 wt% –0.8 wt% of P, 0.06 wt% –1 wt% of Si, 0.03 wt% –2.0 wt% of Zn and the rest being Cu and unavoidable impurities.

In accordance with the fourth invention, there is provided a copper alloy for an electronic device which comprises 2.0 wt% –8 wt% of Ni, 0.1 wt% –0.8 wt% of P, 0.06 wt% –1 wt% of Si, 0.03 wt% –2.0 wt% of Zn and the rest being Cu and unavoidable impurities wherein the oxygen content is 20 ppm or less.

In accordance with the fifth invention, there is provided a method of preparing a strip (or a narrow sheet) of copper alloy for an electronic device which comprises a step of heating a strip (or a narrow sheet) of copper alloy comprising 2.0 wt% –8 wt% of Ni, 0.1 wt% –0.8 wt% of P, 0.06 wt% –1 wt% of Si and the rest being Cu and unavoidable impurities at a temperature of 750° C. –950° C. for more than 1 minute before the final rolling operation for finishing, followed by quenching it in water or oil, and a step of heating the quenched strip (or a narrow sheet) at a temperature of 350° C. –500° C. for more than 10 minutes.

In accordance with the sixth invention, there is provided a method of preparing a strip (or a narrow sheet) of copper alloy for an electronic device which comprises heating a strip (or a narrow sheet) of copper alloy comprising 2.0 wt% –8 wt% of Ni, 0.1 wt% –0.8 wt% of P, 0.06 wt% –1 wt% of Si and the rest being Cu and unavoidable impurities at a temperature of 750° C. –950° C. for more than 1 minute before the final rolling operation for finishing, and slowly cooling the strip (or a narrow sheet) at a rate of 4° C./min. or less.

In accordance with the seventh invention, there is provided a method of preparing a strip (or a narrow sheet) of copper alloy for an electronic device which comprises heating a strip (or a narrow sheet) of copper alloy comprising 2.0 wt% –8 wt% of Ni, 0.1 wt% –0.8 wt% of P, 0.06 wt% –1 wt% of Si and the rest being Cu and unavoidable impurities at a temperature of 750° C. –950° C. for more than 1 minute before the final rolling operation for finishing, cooling the strip (or a narrow sheet) at a rate of 1° C./min. or more until the temperature reaches 500° C., and keeping the temperature or slowly cooling the strip (or a narrow sheet) for at least one hour in a temperature range of 500° C. –350° C.

In accordance with the eighth invention, there is provided a method of preparing a strip (or a narrow sheet) of copper alloy for an electronic device which comprises a step of heating a strip (or a narrow sheet) of copper alloy comprising 2.0 wt% –8 wt% of Ni, 0.1 wt% –0.8 wt% of P, 0.06 wt% –1 wt% of Si, 0.03 wt% –2.0 wt% of Zn and the rest being Cu and unavoidable impurities at a temperature of 750° C. –950° C. for more than 1 minute before the final rolling operation for finishing, followed by quenching it in water or oil, and a step of heating the quenched strip (or a narrow sheet) at a temperature of 350° C. –500° C. for more than 10 minutes.

In accordance with the ninth invention, there is provided a method of preparing a strip (or a narrow sheet) of copper alloy for an electronic device which comprises heating a strip (or a narrow sheet) of copper alloy comprising 2.0 wt% –8 wt% of Ni, 0.1 wt% –0.8 wt% of P, 0.06 wt% –1 wt% of Si, 0.03 wt% –2.0 wt% of Zn and the rest being Cu and unavoidable impurities at a temperature of 750° C. -950° C. for more than 1 minute before the final rolling operation for finishing, and slowly cooling the strip (or a narrow sheet) at a rate of 4° C./min. or less.

In accordance with the tenth invention, there is provided a method of preparing a strip (or a narrow sheet) of copper alloy for an electronic device which comprises heating a wire of copper alloy comprising 2.0 wt% -8 wt% of Ni, 0.1 wt% -0.8 wt% of P, 0.06 wt% -1 wt% of Si, 0.03 wt% -2.0 wt% of Zn and the rest being Cu and unavoidable impurities at a temperature of 750° C. -950° C. for more than 1 minute before the final rolling operation for finishing, cooling the strip (or a narrow sheet) at a rate of 1° C./min or more until the temperature reaches 500° C., and keeping the temperature or slowly cooling the strip (or a narrow sheet) for more than one hour in a temperature range of 500° C. -350° C.

In the above-mentioned inventions, when the content of Ni is less than 1.0 wt%, the production of an intermetallic compound is small and an improvement in strength is also small. When it exceeds 8 wt%, an improvement in the level of strength can not be expected in proportion to an amount of addition. Further, processability and electric conductivity decrease, and heat resistant properties to soldering or plating are deteriorated. In relations among Ni, P and Si, the most desirable result in strength and electric conductivity can be obtained when Ni:P is about 5:1 and Ni:Si is about 4:1. The above-mentioned proportions in weight substantially correspond to $Ni_5P_2$ and $Ni_2Si$ as intermetallic compounds thus, the amounts of P and Si are determined by the above-mentioned weight ratios.

Zn is incorporated to suppress undesired phenomenon such as the peeling-off of a solder layer in high temperature conditions at and after soldering or solder plating. The lower limit of an amount of addition of Zn is 0.03 wt% and the upper limit is 2.0 wt%. The upper limit is determined in consideration of stress-corrosion characteristics.

The upper limit of the oxygen content is 20 ppm. This value was determined from the fact that Ag plating was conducted on a substrate followed by heating it at 450° C. for 5 minutes and no swelling was found.

BRIEF DESCRIPTION OF THE DRAWINGS

FIGS. 1-3 are respectively diagrams showing steps of the embodiments of the method of preparing a strip (or a narrow sheet) of copper alloy according to the present inventions.

Preferred embodiments of the method of preparing a strip (or a narrow sheet) of copper alloy for an electronic device will be described with reference to the drawing.

FIG. 1 is diagram showing steps of the methods of the fifth and the eighth inventions.

In the method according to the fifth invention, a strip (or a narrow sheet) of copper alloy comprising 2.0 wt% -8 wt% of Ni, 0.1 wt% -0.8 wt% of P, 0.06 wt% -1 wt% of Si and the rest being Cu and unavoidable impurities is used.

In the method according to the eighth invention, a strip (or a narrow sheet) W of copper alloy comprising 2.0 wt% -8 wt% of Ni, 0.1 wt% -0.8 wt% of P, 0.06 wt% -1 wt% of Si, 0.03 wt% -2.0 wt% of Zn and the rest being Cu and unavoidable impurities is used. In both methods, the strip (or a narrow sheet) W is subjected to cold working and heat treating repeatedly, and the strip (or a narrow sheet) is heated at a temperature of 750° C. -950° C. for more than one minute in a step A before the final rolling operation for finishing. Then, the strip (or a narrow sheet) is quenched in water or oil in a step B. After the step B, cold working may be conducted in a step C. A heating treatment at a temperature of 350° C. -500° C. is executed for more than 10 minutes in a step D. Cold working may be conducted in a step E if necessary. The steps D and E may be conducted more than two times.

FIG. 2 is a diagram showing the methods according to the sixth and ninth inventions.

In the method according to the sixth invention, a strip (or a narrow sheet) W of copper alloy comprising 2.0 wt% -8 wt% of Ni, 0.1 wt% -0.8 wt% of P, 0.06 wt% -1 wt% of Si and the rest being Cu and unavoidable impurities is used. In the method according to the ninth invention, a strip (or a narrow sheet) W of copper alloy comprising 2.0 wt% -8 wt% of Ni, 0.1 wt% -0.8 wt% of P, 0.06 wt% -1 wt% of Si, 0.03 wt% -2.0 wt% of Zn and the rest being Cu and unavoidable impurities is used.

In both methods, the strip (or a narrow sheet) is subjected to a heating operation at a temperature of 750° C. -950° C. for more than 1 minute before the final rolling operation for finishing in a step A. Then, the strip (or a narrow sheet) is slowly cooled at a cooling rate of 4° C./min. or less in a step $B_2$. Thus, a strip (or a narrow sheet) of copper alloy for an electronic device is produced.

FIG. 3 is a diagram showing the methods according to the seventh and tenth inventions.

In the method according to the seventh invention, a strip (or a narrow sheet) W of copper alloy comprising 2.0 wt% -8 wt% of Ni, 0.1 wt% -0.8 wt% of P, 0.06 wt% -1 wt% of Si and the rest being Cu and unavoidable impurities is used. In the method according to the tenth invention, a strip (or a narrow sheet) of copper alloy comprising 2.0 wt% -8 wt% of Ni, 0.1 wt% -0.8 wt% of P, 0.06 wt% -1 wt% of Si, 0.03 wt% -2.0 wt% of Zn and the rest being Cu and unavoidable impurities is used.

In the both methods, the strip (or a narrow sheet) is repeatedly subjected to cold working and heat treating. In this case, a heat treating operation is executed at a temperature of 750° C. -950° C. for more than 1 minute before the final rolling operation for finishing in a step A. Then, it is cooled at a rate of 1° C./min. or more until the temperature reaches 500° C. in a step $B_3$. Then, temperature is kept for at least one hour in a temperature range of 500° C. -350° C. or the strip (or a narrow sheet) is slowly cooled in that temperature range. Thus, a strip (or a narrow sheet) of copper alloy for an electronic device is produced.

In the following, preferred Examples of the present inventions will be described.

EXAMPLE NOS. 2-4, 6 and COMPARATIVE EXAMPLE NOS. 1-5

Samples Nos. 1, 2, 4-7, 9-11 having the formulations as in Table 1 were prepared as follows. Each set of compositions as described in Table 1 was molten in a radiofrequency electric furnace and molten mass was poured in a casting mold having a thickness of 20 mm. The surfaces of each ingot were shaved and the ingots were repeatedly subjected to cold rolling and heat treating operations. After the final 50% cold working, each of the ingot was formed into a plate-like material having a thickness of 0.25 mm to thereby prepare samples. Before the final rolling operation for finishing, each sample was heated at 800° C. for 30 minutes followed by quenching it in water. Thereafter, each of the samples was subjected to an annealing treatment at 400° C. for 2 hours.

Physical properties of the Samples No. 1 –No. 11 are shown in Table 1.

properties to solder as well as the strength are improved to the level of Sample No. 4 of the present alloy, but the sensitivity to stress-corrosion remarkably increases. Accordingly, the content of Zn is determined to be 0.03 wt% -2.0 wt% in the present invention.

The copper alloy comprising Ni, P, and Si of the present invention has a high level of strength and excellent electric conductivity. Accordingly, it is useful in the miniaturization of the parts of electronic devices. It

TABLE 1

| Example No. | Sample No. | Composition (wt %) | | | | | | Tensile strength (kgf/mm$^2$) | Electric conductivity (% IACS) | Sensitivity to stress-corrosion (HR) (1) | Heat resistance to soldering (Hr) (2) | Swelling in Ag-plated wire (3) | Remark |
| --- | --- | --- | --- | --- | --- | --- | --- | --- | --- | --- | --- | --- | --- |
| | | Ni | P | Si | Zn | O$_2$ (ppm) | Cu | | | | | | |
| Comparative Example 1 | 1 | 0.81 | 0.20 | — | — | 10 | the rest | 49.3 | 71.5 | 400 or more | 500 or more | No | Comparative Example |
| Comparative Example 2 | 2 | 1.52 | 0.31 | — | — | 15 | the rest | 59.6 | 67.5 | 400 or more | 500 or more | No | Comparative Example |
| Example 2 | 4 | 2.73 | 0.29 | 0.31 | — | 13 | the rest | 68.8 | 50.2 | 400 or more | 500 or more | No | Present invention |
| Example 3 | 5 | 3.76 | 0.19 | 0.70 | 1.63 | 16 | the rest | 73.2 | 40.6 | 400 or more | 500 or more | No | Present invention |
| Example 4 | 6 | 7.03 | 0.62 | 0.54 | — | 14 | the rest | 80.7 | 25.6 | 400 or more | 350 | No | Present invention |
| Comparative Example 3 | 7 | 10.62 | 1.02 | 1.23 | — | 28 | the rest | 86.3 | 18.7 | 400 or more | 300 | Yes | Comparative Example |
| Comparative Example 4 | 9 | 1.47 | 0.19 | 0.13 | 2.82 | 15 | the rest | 67.2 | 50.8 | 300 | 500 or more | No | Comparative Example |
| Comparative Example 5 | 10 | 1.54 | 0.20 | 0.12 | 1.32 | 32 | the rest | 66.2 | 51.5 | 400 or more | 500 or more | Yes | Comparative Example |
| Example 6 | 11 | 3.83 | 0.21 | 0.72 | 0.15 | 16 | the rest | 69.2 | 48.7 | 400 or more | 500 or more | No | Present invention |

Note
(1) Tests of stress-corrosion to ammonium were conducted to measure time to breaking. Conditions: Maximum bending stress: 30 kgf/mm$^2$, Temperature: 40° C., Atmosphere: A commercially available first grade reagent was diluted with an equal amount of water; the diluted reagent was poured in the bottom of a desicator, and a sample is placed above the reagent.
(2) A sample was immersed in a molten 9/1 solder bath to conduct soldering and then the soldered sample was kept in an atmosphere of 150° C. Each sample was subjected to a close-contact bending method and time to the peeling-off was measured.
(3) An Ag layer having a thickness of 8 μm was formed on each sample by Ag plating. The sample was heated at 350° C. for 5 minutes. The sample was checked whether or not swelling due to the peeling-off of the Ag layer takes place.

From the result as shown in Table 1, samples including Si exhibit higher strength than the samples comprising only Cu, Ni and P. Generally, the strength is improved as the contents of Ni, P and Si increase. However, when the contents of these elements are too large, the electric conductivity reduces. Accordingly, the content of Ni is determined to be 2.0-8.0 wt% in order to secure the aimed desirable electric conductivity and strength. In connection with the content of Ni, the contents of P and Si are also determined as described in the present invention in order to secure the production efficiency of an intermetallic compound.

As to the content of O$_2$, in the tests of heating, the swelling of the plated layer was found in the samples (No. 7 and 10) which have an oxygen content of more than 20 ppm. Accordingly, the upper limit of the oxygen content is determined to be 20 ppm in the present inventions.

As to heat resistance properties to solder, when the contents of Ni, P and Si increase, the resistance properties decrease. Samples No. 11 and 5 including 0.15 wt% and 1.63 wt% of Zn improves the heat resistance properties to solder. On the other hand, in Sample No. 9 including an excessive amount of Zn, the heat resistance can be widely applied to not only a lead frame in an integrated circuit but also a connector, a relay, a switch and so on. Further, the copper alloy including Zn further improves a level of strength because it has excellent heat resistance properties.

EXAMPLE NO. 9, 13 and 15 and COMPARATIVE EXAMPLE NOS. 6 and 7

Cu-Ni-P-Si alloy and Cu-Ni-P-Si-Zn alloy having the formulation as shown in Table 2 were used to form strips (or narrow sheets) of copper alloy by using the methods as specified in Table 2.

Samples Nos. 14, 18, 20, 22 and 23 were prepared as follows. Each composition for Samples Nos. 14, 18, 20, 22 and 23 was molten in a radiofrequency electric furnace and the molten mass was poured in a casting mold having a thickness of 20 mm to form each ingot. Each of the ingot was shaved its surfaces and was repeatedly subjected to cold rolling and heat treating operations to thereby form each sample. Then, each sample was subjected to the final 50% cold rolling operations to be finished to a plate-like material having a thickness of 25 mm. The conditions of a heat treatment and other treatments are shown in Table 2.

In Example 9 for Sample 14 and Example 13 for Sample 18, the copper alloy plates having a thickness of 0.5 mm were respectively heated at 800° C. for 30 minutes, followed by quenching them in water. Then, a cold rolling method was executed to each of the copper alloy plates to reduce the thickness of the plates to 0.25 mm. Further, the plates were heated at 450° C. for 2 hours and were slowly cooled in the heating furnace.

In Example 15 for Sample 20, the sample was heated in the same manner as in Example 9, followed by slowly cooling them at at least cooling speed of 2.5° C./min. in the heating furnace. Then, a cold working was conducted to reduce the thickness to 0.25 mm.

As Comparative Example 6, Sample No. 22 having a thickness of 0.5 mm was heated at 700° C. for one hour, followed by quenching it in water. A cold rolling method was conducted to reduce the thickness to 0.25 mm.

As Comparative Example 7, Sample 23 was treated in the same manner as Comparative Example 6. In addition, it was heated at 450° C. for 2 hours, and was slowly cooled in the heating furnace.

For the Sample Nos. 14, 18, 20, 22 and 23, the tensile strength and the electric conductivity were measured. Table 2 shows results of the measurement.

tivity can be obtained, and the strip (or a narrow sheet) of copper alloy of the present inventions is very useful for miniaturization of electronic devices.

What is claimed is:

1. A copper alloy for an electronic device which consists essentially of 2.0 wt.% –8 wt.% of Ni, 0.1 wt.% –0.8 wt% of P, 0.06 wt.% –1 wt.% of Si and the rest being Cu and unavoidable impurities, wherein the weight ratio of Ni: P+Si is within the range of from 4.12:1 to 6.06:1; and wherein $Ni_5P_2$ and $Ni_2Si$ intermetallic compounds are present.

2. A copper alloy for an electronic device which consists essentially of 2.0 wt% –8 wt.% of Ni, 0.1 wt.% –0.8 wt% of P, 0.06 wt.% –1 wt.% of Si and the rest being Cu and unavoidable impurities, wherein the oxygen content is 20 ppm or less and wherein he weight ratio of Ni: P+Si is within the range of from 4.12:1 to 6.06:1; and wherein $Ni_5P_2$ and $Ni_2Si$ intermetallic compounds are present.

3. A copper alloy for an electronic device which consists essentially of 2.0 wt.% –8 wt.% of Ni, 0.1 wt.% –0.8 wt% of P, 0.06 wt.% –1 wt.% of Si, 0.03 wt.% ≧2.0 wt.% of Zn and the rest being Cu and unavoidable impurities, wherein the weight ratio of Ni: P+Si is within the range of rom 4.12:1 to 6.06:1; and

TABLE 2

| Example No. | Sample No. | Composition (wt %) | | | | | Manufacturing step | Tensile strength (kgf/mm²) | Electric conductivity % IACS | Method of the invention |
|---|---|---|---|---|---|---|---|---|---|---|
| | | Ni | P | Si | Zn | Cu | | | | |
| 9 | 14 | 3.76 | 0.19 | 0.70 | — | the rest | 0.5 mm→Heat treatment (800° C. × 30 min, then cooling in water)→cold rolling to reduce the thickness of 0.25 mm→Heat treatment (450° C. × 2 hr, then cooling in furnace) | 73.2 | 40.6 | 5 |
| 13 | 18 | 3.83 | 0.21 | 0.72 | 0.15 | the rest | 0.5 mm→Heat treatment (800° C. × 30 min, then cooling in water)→cold rolling to reduce the thickness of 0.25 mm→Heat treatment (450° C. × 2 hr, then cooliing in furnace) | 69.2 | 48.7 | 8 |
| 15 | 20 | 3.83 | 0.21 | 0.72 | 0.15 | the rest | 0.5 mm→Heat treatment (800° C. × 30 min, then cooling in furnace, the maximum cooling rate 2.5° C./min)→cold rolling to reduce the thickness of 0.25 mm | 64.3 | 42.0 | 9 |
| Comparative Example 6 | 22 | 1.52 | 0.21 | 0.11 | — | the rest | 0.5 mm→Heat treatment (700° C. × 1 hr, then cooling in water)→cold rolling to reduce the thickness of 0.25 mm | 56.4 | 45.6 | — |
| Comparative Example 7 | 23 | 1.52 | 0.21 | 0.11 | — | the rest | 0.5 mm→Heat treatment (700° C. × 1 hr, then cooling in water)→cold rolling to reduce the thickness of 0.25 mm→Heat treatment (450° C. × 2 hr, then cooling in furnace) | 58.8 | 62.3 | — |

As is clear from Table 2, the samples of Examples 9, 13 and 15 exhibit higher strength than the samples of the Comparative Examples 6 and 7.

At the final rolling operation, the copper alloy material may be heated at a temperature of 150° C. –450° C. for more than 3 minutes to remove a deformation resulted from the rolling operation. It is effective to improve spring characteristics and processability of the material.

Thus, by subjecting a Cu-Ni-P-Si alloy or a Cu-Ni-P-Si-Zn alloy having a specified formulation to a specified heat treatment, a strip (or a narrow sheet) of copper alloy having good tensile strength and electric conducwherein $Ni_5P_2$ and $Ni_2Si$ intermetallic compounds are present.

4. A copper alloy for an electronic device which consists essentially of 2.0 wt.% –8 wt.% of Ni, 0.1 wt.% –0.8 wt.% of P, 0.06 wt.% –1 wt.% of Si, 0.03 wt.% –2.0 wt.% of Zn and the rest being cu and unavoidable impurities, wherein the oxygen content is 20 ppm or less and wherein he weight ratio of Ni: P'Si is within the range of from 4.12:1 to 6.06:1; and wherein $Ni_5P_2$ and $Ni_2Si$ intermetallic compounds are present.

* * * * *